United States Patent [19]

de Ferron

[11] Patent Number: 4,811,291

[45] Date of Patent: Mar. 7, 1989

[54] SAFETY DEVICE FOR ELECTRICALLY PROGRAMMABLE READ-ONLY MEMORY

[75] Inventor: Gérard S. de Ferron, Greaque, France

[73] Assignee: Thomson Composants Militaires et Spaciaux, Paris, France

[21] Appl. No.: 52,068

[22] Filed: May 21, 1987

[30] Foreign Application Priority Data

May 23, 1986 [FR] France .................... 86 07386

[51] Int. Cl.[4] .......................... G11C 13/00
[52] U.S. Cl. .................... 365/185; 365/184; 365/210; 365/228
[58] Field of Search ............ 365/185, 184, 210, 228

[56] References Cited

U.S. PATENT DOCUMENTS 4,683,554 7/1987 Lockwood et al. ............ 365/185

FOREIGN PATENT DOCUMENTS 0086360 8/1983 European Pat. Off. .

OTHER PUBLICATIONS

Patents Abstracts of Japan, vol. 5, No. 169 (P-86) [841], Oct. 28, 1981.
JP-A-56 98 790 (Nippon Denki K.K.) 08-08-1981.

Primary Examiner—Terrell W. Fears
Attorney, Agent, or Firm—Oblon, Fisher, Spivak, McClelland & Maier

[57] ABSTRACT

A safety device for an electrically programmable read-only memory of the type comprising a matrix of memory cells, each comprising a floating gate MOS transistor that exhibits a defined threshold voltage after programming, each cell being accessible by rows and columns connected to means which can be used to apply, to these rows and columns, potentials representing the data to be recorded in the cells or potentials representing the command for reading the recorded data. This device comprises at least one reference memory cell included in the memory, the memory cell exhibiting a threshold voltage, after programming, which is lower than the minimum of the dispersal of threshold voltages of the transistors of the matrix.

9 Claims, 2 Drawing Sheets

FIG_1-a
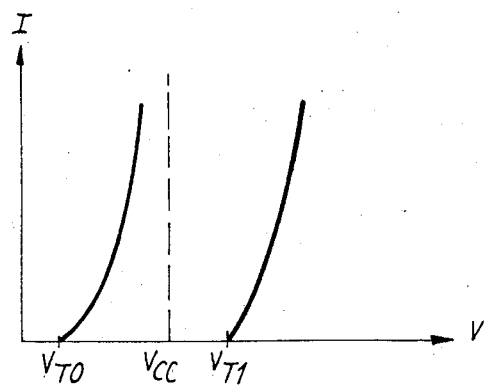
FIG_1-b
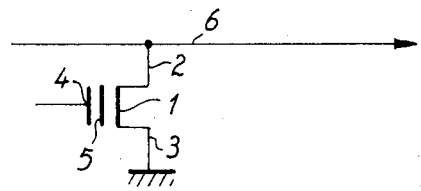

FIG_2-a
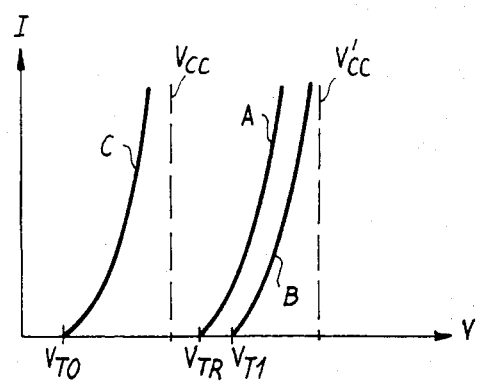
FIG_2-b
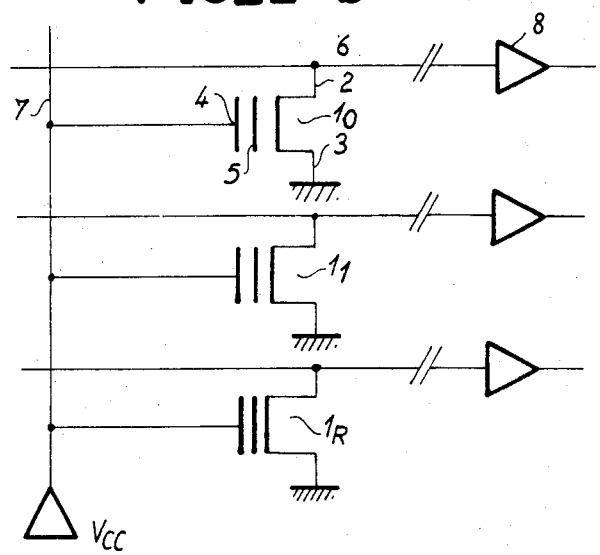
FIG_3
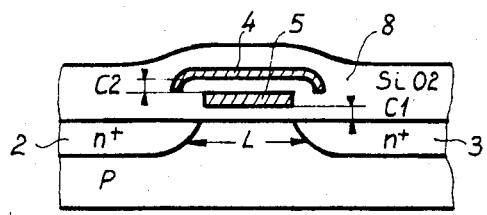

SAFETY DEVICE FOR ELECTRICALLY PROGRAMMABLE READ-ONLY MEMORY

BACKGROUND OF THE INVENTION

The present invention pertains to a safety device for electrically programmable read-only memories such as EPROM memories or EEPROM memories. It pertains more especially to a safety device for electrically programmable read-only memories designed to receive confidential information that cannot be altered by a fraudulent person. Memories of this type are used, for example, in memory cards which are also called CCC cards.

Generally, in memories of the above type, each data storage element or memory cell comprises a floating gate MOS transistor which may be mainly of the FAMOS (floating gate avalanche injection MOS) type or the SAMOS (stacked gate avalanche injection MOS) type. The above MOS transistor may have two states. For an N-channel MOS transistor, in a first state there is no charge trapped in the floating gate. A conduction channel may exist between the source and the drain. The transistor is then conductive and behaves like a closed switch. In a second state, electrons have been trapped in the floating gate. They prevent the creation of a conduction channel in the substrate between the source and the drain. In this case, the transistor is off and behaves like an open switch.

To programme a MOS transistor 1 of the type represented in FIG. 1b, voltages higher than the normal operating voltage are appropriately applied to the control gate 4 and the electrode 2 so that the floating gate 5 absorbs and retains a charge of electrons. This charge of electrons at the floating gate 5 raises the conduction threshold, at the control gate 4 of the transistor, from the minimal theshold voltage $V_{T0}$ of the non-programmed transistors to a higher threshold voltage $V_{T1}$ as shown in FIG. 1a, which gives the graph of the working characteristic of a SAMOS type floating gate transistor.

To read a memory which is thus programmed, a voltage Vcc, lower than the threshold voltage $V_{T1}$ of the programmed transistors but higher than the minimum voltage $V_{T0}$ of the non-programmed transistors, should be applied to the control gate. This reading voltage can be used to detect whether the transistor is on or off. As depicted in FIG. 1b, the transistor 1 generally is linked by the electrode 2 to a bit line 6 which is voltage biased by a generator. The other electrode 3 of the transistor is linked to the ground. The bit line 6 is also linked to a current detector which is not shown. This detector measures the current put through the line by the generator. If the memory cell has not been programmed, the transistor is on and, when the reading voltage Vcc which is greater than $V_{T0}$ is applied, the transistor is put into saturation mode. A drop in current is detected on the detector. In the latter case, when the memory cell has been programmed, charges are trapped in the floating gate of the transistor. The reading voltage Vcc, applied to the control gate is, in this case, in the opposite direction to the potential barrier created in the conduction channel by the charges stored in the floating gate. However, this voltage is then not enough to modify the conduction of the channel and the transistor stays off. As a consequence, the detector at the end of the bit line does not detect the current variation.

When the above memories are used in memory cards, the manufacturer programmes a number of data, some of which must be absolutely non-falsifiable. Information of this type includes for example, the secret code of the user. Now if, for the reading voltage Vcc, a voltage greater than the threshold voltage $V_{T1}$ is used, whether or not the memory cells are programmed, a drop in current is detected on the detectors. Consequently, all the memory cells of the secret code are read as if they were not programmed.

To remove this disadvantage, it has been proposed to use, for example, reference bits, namely points that are programmed only once. In this case, if an attempt is made to erase the code, the reference bits are obligatorily erased and the card is invalidated. The card can therefore no longer be used.

The present invention proposes a new method to remove this disadvantage, a method by which the memory card can be used again.

SUMMARY OF THE INVENTION

The object of the present invention, therefore, is a safety device for an electrically programmable read-only memory of the type comprising a matrix of memory cells, each memory cell comprising a floating gate MOS transistor that exhibits a defined threshold voltage after programming, each cell being accessible by rows and columns connected to means which can be used to apply, to these rows and columns, potentials representing the data to be recorded in the cells or potentials representing the command for the reading of the recorded data, safety device comprising at least one reference memory cell included in the memory, the said memory cell exhibiting a threshold voltage, after programming, which is lower than the minimum of the dispersal of the threshold voltages of the matrix transistors.

A memory cell for which the threshold voltage after programming is lower than the minimum of the dispersal of the threshold voltages of the matrix transistors can be made in different ways.

According to a preferred embodiment, a memory cell according to the present invention has an effective length which is greater than that of the other memory cells.

According to another embodiment, a memory cell according to the present invention will exhibit a $\gamma$, namely a floating gate/control gate/substrate coupling which is weaker than that of the other memory cells. This can be obtained either by increasing the floating gate/substrate capacitance or by diminishing the floating gate/control gate capacitance.

According to yet another embodiment of the present invention, the threshold voltage of the reference memory cell can be lowered by increasing the value of the charge resistance during programming.

According to yet another mode of embodiment, the threshold voltage of the reference memory cell can be lowered by increasing the source resistance.

In this case, however, the memory cell should be positioned at the periphery of the matrix or memory field, because the length of the diffused zone is increased.

According to another embodiment, which can be easily applied, it is possible to make a memory cell that exhibits a lowered threshold voltage by reducing the programming time and/or the programming voltage. However, this method reduces the lifetime of the memory as is well-known to the specialist. In fact, it can be considered only for memories with a lifetime of less than 10 years.

BRIEF DESCRIPTION OF THE DRAWINGS

Other characteristics and advantages of this invention will emerge from the following description of an embodiment, made with reference to the appended drawings of which:

FIGS. 1A and 1B, already described, respectively show the voltage-current characteristic of a memory cell with a floating gate transistor, and the said memory cell with a floating gate transistor, FIGS. 2A and 2B respectively show the voltage-current characteristics of two memory cells programmed at "0" and "1" and a reference memory cell according to the present invention, as well as a part of a memory field comprising the said reference memory cell, and FIG. 3 represents a cross-section view of a memory cell with a floating gate transistor.

To simplify the description, the same references are used for the same parts in all the drawings.

DESCRIPTION OF THE PREFERRED EMBODIMENT

FIG. 2B shows three memory cells of one and the same column. These memory cells each comprise a floating gate transistor of the same type as the floating gate transistor of FIG. 1B. Among the three memory cells shown, the memory cell marked $1_R$ is a reference memory cell according to the present invention. This memory cell has a structure which is identical to that of the other memory cells, but it exhibits a threshold voltage after programming which is lower than the minimum of the threshold voltage dispersal of the matrix transistor. The other memory cells marked $1_0$ to $1_1$ respectively represent a memory cell programmed "0" and a memory cell programmed "1".

More specifically, as is shown in FIG. 2B, each memory cell $1_0$, $1_1$ and $1_R$ of the electrically programmed read-only memory is of the transistor type with a floating gate 5. The transistors have two main electrodes, 3 and 2 respectively and a control gate 4 stacked on the floating gate 5. One of the main electrodes, namely the electrode 3 in the embodiment shown, is linked to the ground, while the electrode 2 is linked to a row 6 known as a bit line. The control gate 4 is linked to another connection 7 known as a word line. The bit lines and word lines are arranged in rows and columns to determine a matrix that includes the memory cells. This memory further comprises means that are known to the specialist and are not shown, such as a row decoder and a column decoder to apply, to the rows and columns, potentials that represent the data to be recorded or potentials that represent the data reading command.

Thus, to read a memory cell, a current produced by an output of the row decoder is transferred to the bit line. Through the column decoder, a control pulse Vcc is sent to the word line 7. The transistor comes on or stays off depending on whether or not the charges have been previously trapped at the floating gate 4. Besides, a current detector 8 connected to each end of the bit lines 6 detects a variation or absence of variation of current. From this it deduces that the memory cell has been programmed "1" or "0" respectively.

According to the present invention, there is at least one reference memory cell in the memory field, the threshold voltage after programming of this memory cell being lower than the minimum threshold voltages of the matrix transistors. As mentioned above, this reference memory cell is the cell $1_R$ in the embodiment shown in FIG. 2B. Since the threshold voltage $V_{TR}$ of this cell, after programming, is lower than the threshold voltages after programming of the other cells, the cell $1_R$ exhibits the voltage-current characteristic given by the curve A. Furthermore, the memory cell $1_1$, programmed at "1", exhibits the voltage-current characteristic given by the curve B with a threshold voltage $V_{T1}$ and the memory cell $1_0$ programmed at "0" exhibits the voltage-current characteristic given by the curve C with a threshold voltage of $V_{T0}$ Consequently if, during the reading, a normal pulse Vcc is applied, namely a pulse Vcc such as $V_{T0} < Vcc < V_{TR} < V_{T1}$, a current variation is detected on the detector 8 linked to the memory cell $1_0$ programmed at "0", and zero current is detected on the detector connected to the memory cell $1_1$ programmed at "1" and to the reference memory cell respectively.

However if, during the reading, a fraudulent pulse V'cc is applied, namely a pulse V'cc such as $V_{T0} < V_{TR} < V_{T1} < V'cc$, a current variation is detected on all the detectors.

This type of reading is done by means of a software programme which selects the memory words as well as the bit lines. Thus, to prevent any fraud, it is enough to read first of all the reference memory cell. If no current variation is detected at this cell, it means that the reading pulse has a normal Vcc voltage. Consequently, the reading of the other cells is authorized. On the contrary, if a current variation is detected, it means that the V'cc voltage of the reading pulse is too high. Thus, a fraud is being attempted and the reading of the other memory cells is prohibited.

In the case of the present invention, it is thus enough to have one reference memory cell for the entire memory field. However, several cells may be used if desired. Furthermore, the reference memory cell is not erased during the reading. The memory, and especially the card containing this memory, can be used again without any problem.

Various means can be used to reduce the threshold voltage of a floating gate transistor memory cell. To illustrate some of these means, FIG. 3 gives a cross-section view of a floating gate transistor. In the embodiment shown, it is an N-channel MOS transistor. The electrodes 2 and 3 are made up of n+ diffusions in a p type substrate. The floating gate 5 and the control gate 4 are made of polycrystalline silicon for example. The insulating material 8 is made of silicon oxide $SiO_2$.

To reduce the threshold voltage it is possible, according to a preferred embodiment, to increase the effective length of the channel. For if the length of the channel is increased by 0.25 microns for an initial length of 3 microns, the threshold voltage goes from 8 V to 7 V.

Furthermore, the threshold voltage can be modified by altering the $\gamma$, namely the floating gate/control gate/substrate coupling A reduction of $\gamma$ is obtained, either by increasing the floating gate/substrate capacitance C1 or by diminishing the floating gate/control gate capacitance C2. Thus by diminishing the $\gamma$ from 0.74 to 0.7, the threshold voltage goes from 8 V to 7 V. However, this characteristic is more difficult to check.

Other means can be used as mentioned in the introduction.

The source resistance can be increased by increasing the length of the n+2 diffused zone. In this case, the memory cell must be positioned at the periphery of the memory field.

The value of the charge resistance can also be increased during the programming. However, since the charge resistance is common to several cells, generally to one column, specific charge resistance must be provided for if necessary. Thus, by making the charge resistance go from 4 Kohms to 8 Kohms, the threshold voltage drops by 2.5 V.

The programming time and/or the programming voltage can also be used to modify the threshold voltage. If the programming voltage goes from 21 V to 19 V, the threshold voltage drops by 1.5 V. Furthermore, if the programming time goes from 50 ms to 100 microseconds, the threshold voltage drops by one volt. This latter solution cannot be considered unless the retention time is less than 10 years.

What is claimed is:

1. A safety device for an electrically programmable read-only memory, comprising:
    a matrix of memory cells, each memory cell of said matrix of memory cells comprising a floating gate MOS transistor, one cell of said matrix of memory cells being reference memory cell for the other memory cells of said matrix of memory cells, said reference memory cell having a control gate, said memory cells of said matrix of memory cells being electrically connected;
    a threshold voltage of said reference memory cell after programming being less than a threshold voltage after programming of the other memory cells of said matrix of memory cells, the other memory cells of said matrix of memory cells before programming having a threshold voltage less than said threshold voltage of said reference memory cell after programming;
    said safety device including means for reading control, said means for reading control allowing reading of the other memory cells of said matrix of memory cells when a voltage applied to the control gate of said reference memory cell is greater than the threshold voltage before programming of the other memory cells of said matrix of memory cells and is less than the threshold voltage of said reference memory cell after programming, said means for reading control connecting to said memory cells of said matrix of memory cells; and
    said means for reading control preventing reading of the other memory cells of said matrix of memory cells when a voltage applied to the control gate of said reference cell is greater than the threshold voltage of said reference memory cell after programming.

2. A device according to claim 1, wherein the reference memory cell comprises a floating gate MOS transistor with a channel which has an effective length greater than the other memory cells.

3. A device according to the claim 1, wherein the reference memory cell comprises a floating gate MOS transistor, the floating gate/control gate/substrate coupling of which is weaker than that of the other memory cells.

4. A device according claim 3, wherein the coupling which is weaker than that of the other memory cells is obtained by decreasing the floating gate/control gate capacitance..

5. A device according to claim 3, wherein the coupling which is weaker than that of the the memory cells is obtained by increasing the floating gate/substrate capacitance.

6. A device according to claim 1, wherein the threshold voltage of the reference memory cell is lowered in comparison with that of the other cells by increasing the value of the charge resistance during the programming.

7. A device according to claim 1, wherein the reference memory cell comprising a floating gate MOS transistor has a source resistance which is increased in comparison with that of the other memory cells.

8. A device according to claim 1, wherein the threshold voltage of the reference memory cell is lowered in comparison with that of the other memory cells by reducing programming time and programming voltage.

9. A device according to claim 1, wherein:
    the other memory cells of said matrix of memory cells before programming are effectively programmed at zero, and the other memory cells of said matrix of memory cells after programming are programmed at one.

* * * * *